United States Patent
Mukojima

(10) Patent No.: US 11,435,051 B2
(45) Date of Patent: Sep. 6, 2022

(54) OPTICAL UNIT

(71) Applicant: KOITO MANUFACTURING CO., LTD., Tokyo (JP)

(72) Inventor: Kenta Mukojima, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 17/434,951

(22) PCT Filed: Feb. 20, 2020

(86) PCT No.: PCT/JP2020/006788
§ 371 (c)(1),
(2) Date: Aug. 30, 2021

(87) PCT Pub. No.: WO2020/179471
PCT Pub. Date: Sep. 10, 2020

(65) Prior Publication Data
US 2022/0170607 A1    Jun. 2, 2022

(30) Foreign Application Priority Data
Mar. 7, 2019    (JP) .............................. JP2019-041268

(51) Int. Cl.
*F21S 41/151*    (2018.01)
*F21V 13/04*    (2006.01)
(Continued)

(52) U.S. Cl.
CPC ............. *F21S 41/43* (2018.01); *F21S 41/151* (2018.01); *F21S 41/265* (2018.01); *F21S 41/47* (2018.01);
(Continued)

(58) Field of Classification Search
CPC ........ F21S 41/151; F21S 41/153; F21S 43/40; F21V 5/007; F21V 13/04; F21V 13/10
See application file for complete search history.

(56) References Cited

U.S. PATENT DOCUMENTS 6,545,811 B1    4/2003    Fujimoto
7,116,484 B2    10/2006    Nemoto et al.
(Continued)

FOREIGN PATENT DOCUMENTS

CN    101034167 A    9/2007
CN    102293052 A    12/2011
(Continued)

OTHER PUBLICATIONS

International Search Report dated Apr. 14, 2020 issued in Patent Application No. PCT/JP2020/006788.
(Continued)

*Primary Examiner* — Sean P Gramling
(74) *Attorney, Agent, or Firm* — Pearne & Gordon LLP

(57) ABSTRACT

Provided is an optical unit capable of preventing unintended light distribution and having a small assembly error while using a plurality of light sources and a plurality of lenses. An optical unit (10) includes: a plurality of light sources (26); a plurality of first lenses (30) integrally formed, respectively arranged to correspond to each of the light sources (26), condensing light from the corresponding light sources (26), and forming corresponding light source images on a predetermined virtual plane; a second lens (12) projecting projected images of the light source images forward; and a light-shielding member (31) extending between two adjacent first lenses (30) in the first lenses (30), and shielding light passing through one first lens (30) so as not to enter the
(Continued)

other first lens (30), in which the light-shielding member (31) and the first lenses (30) are integrally formed by two-color molding.

14 Claims, 10 Drawing Sheets

(51) Int. Cl.
    *F21S 41/43*     (2018.01)
    *F21S 41/265*     (2018.01)
    *F21S 41/47*     (2018.01)
    *F21S 43/40*     (2018.01)
    *F21V 5/00*     (2018.01)
(52) U.S. Cl.
    CPC .............. *F21S 43/40* (2018.01); *F21V 5/007* (2013.01); *F21V 13/04* (2013.01)

(56) References Cited

U.S. PATENT DOCUMENTS

| 7,242,526 | B2 | 7/2007 | Nemoto et al. |
| 8,823,254 | B2 | 9/2014 | Ohta et al. |
| 2005/0002105 | A1 | 1/2005 | Nemoto et al. |
| 2006/0132725 | A1 | 6/2006 | Terada et al. |
| 2006/0262412 | A1 | 11/2006 | Nemoto et al. |
| 2007/0241469 | A1 | 10/2007 | Nemoto et al. |
| 2012/0218173 | A1 | 8/2012 | Ohta et al. |

FOREIGN PATENT DOCUMENTS

| CN | 106199893 A | 12/2016 | |
| EP | 2357399 A1 * | 8/2011 | .......... F21S 48/1131 |
| JP | 2004-220015 A | 8/2004 | |
| JP | 2007-230374 A | 9/2007 | |
| JP | 2011-171002 A | 9/2011 | |
| JP | 2014-041802 A | 3/2014 | |
| JP | 2018-060129 A | 4/2018 | |
| JP | 2018-073516 A | 5/2018 | |

OTHER PUBLICATIONS

Office Action dated May 26, 2022 for the corresponding Chinese Patent Application No. 202080017979.7.

* cited by examiner

FIG. 4
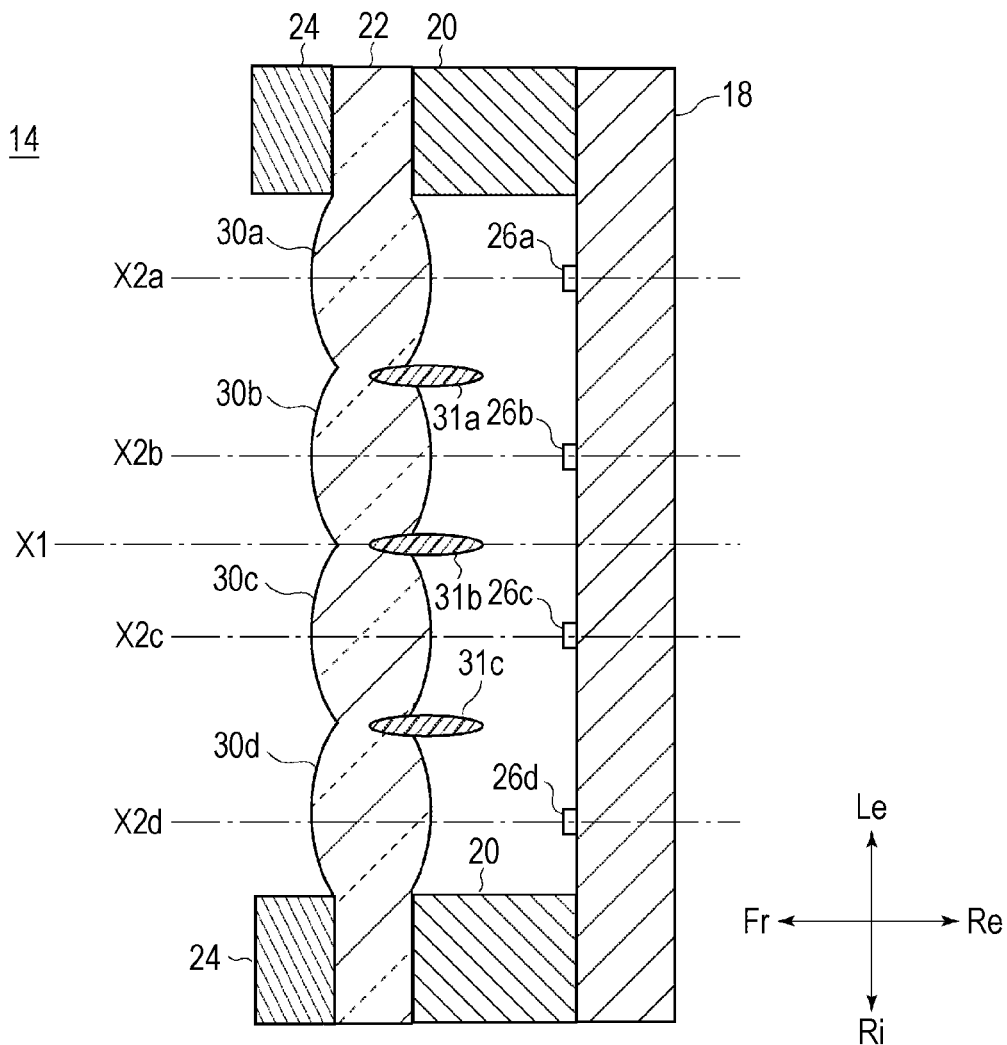
(a)
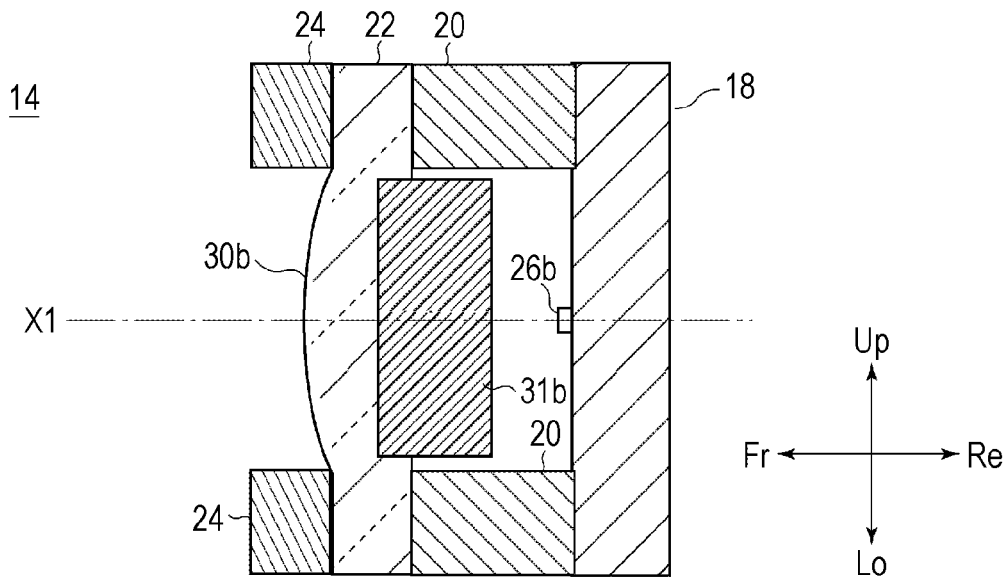
(b)

FIG. 5
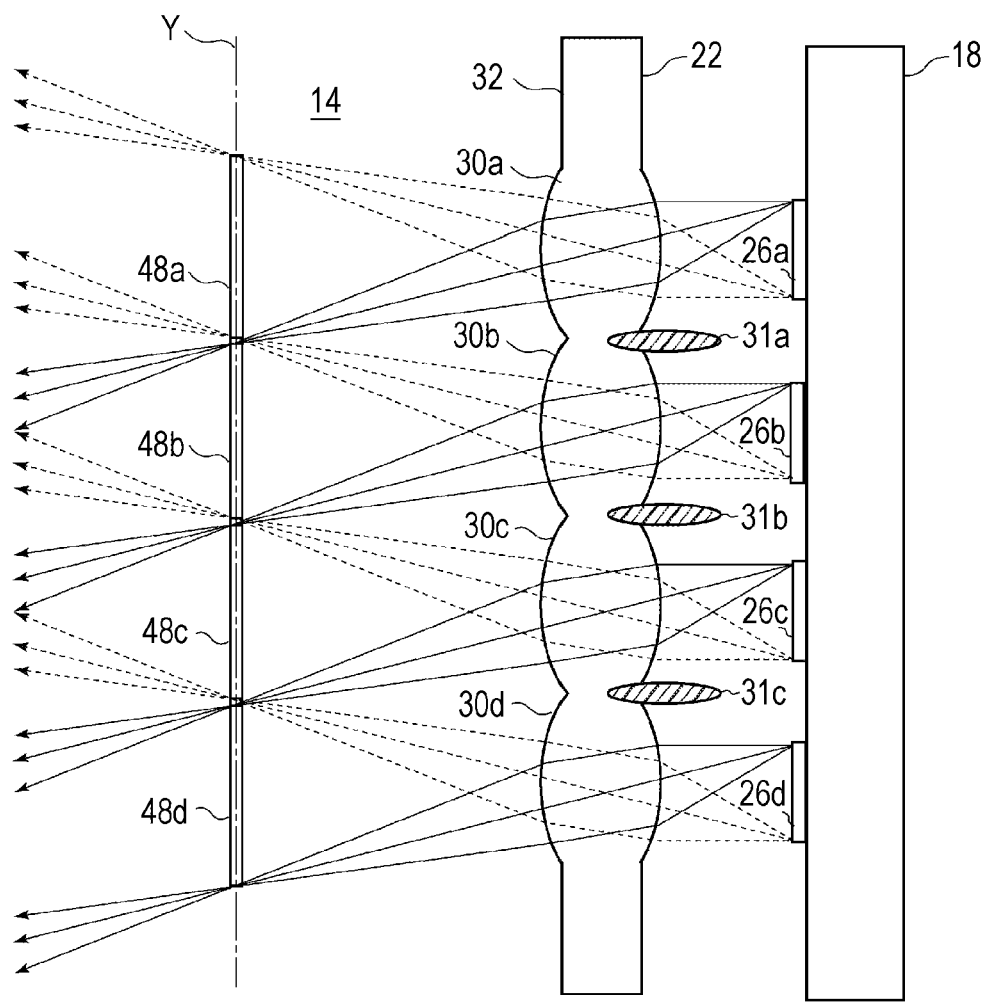
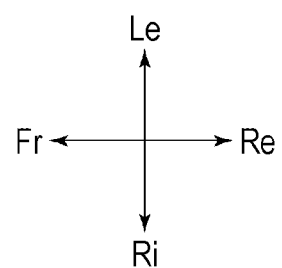

FIG. 7
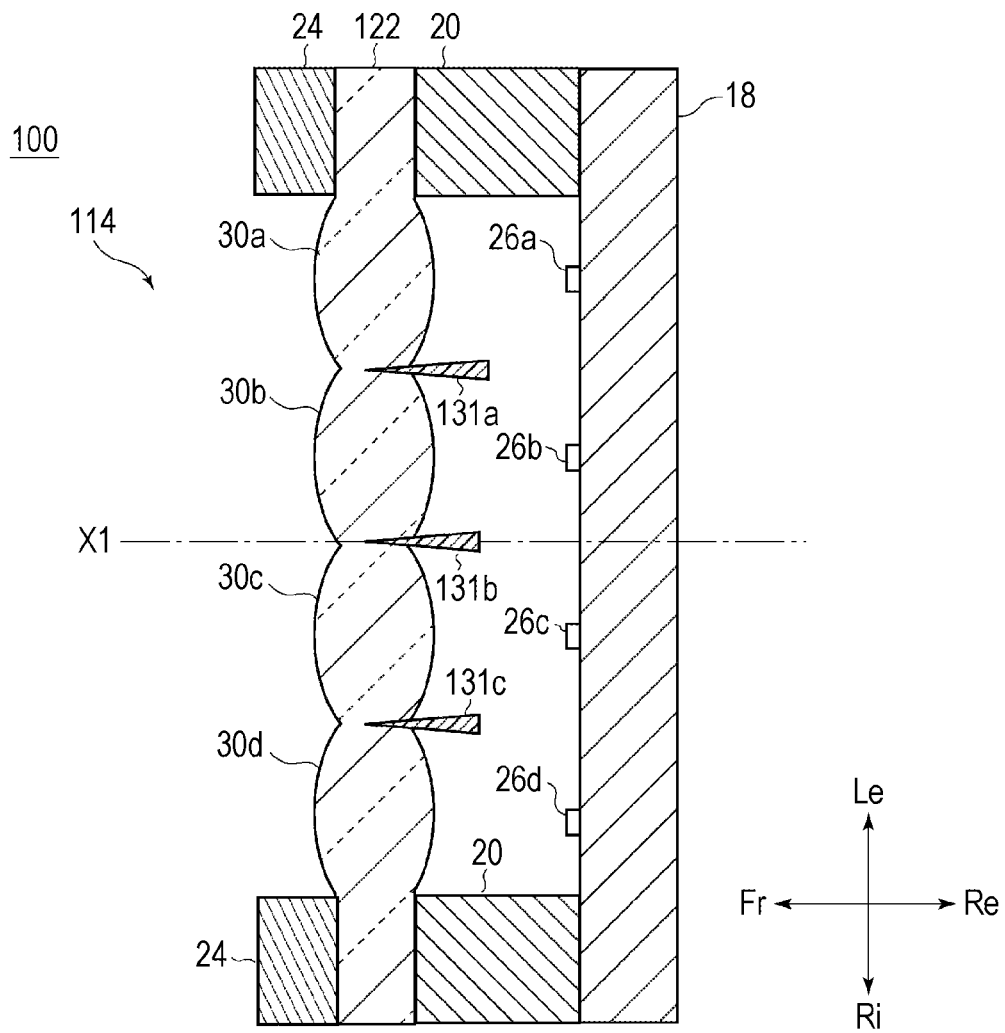
(a)
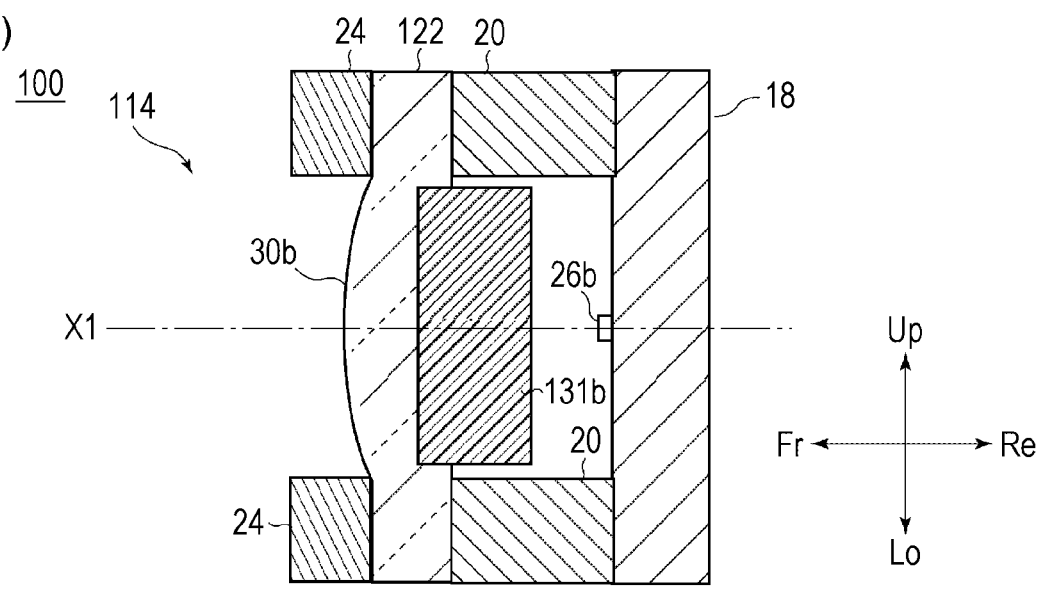
(b)

FIG. 8
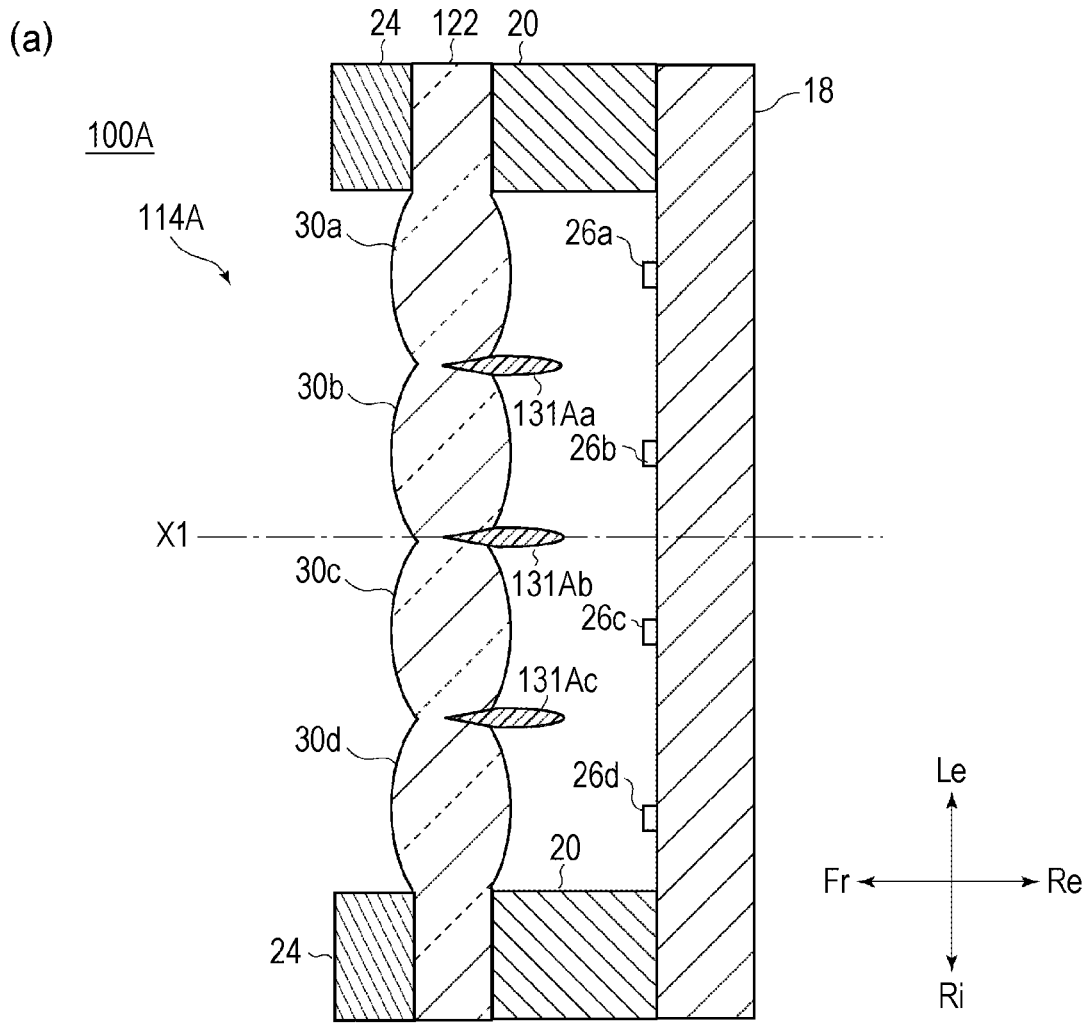
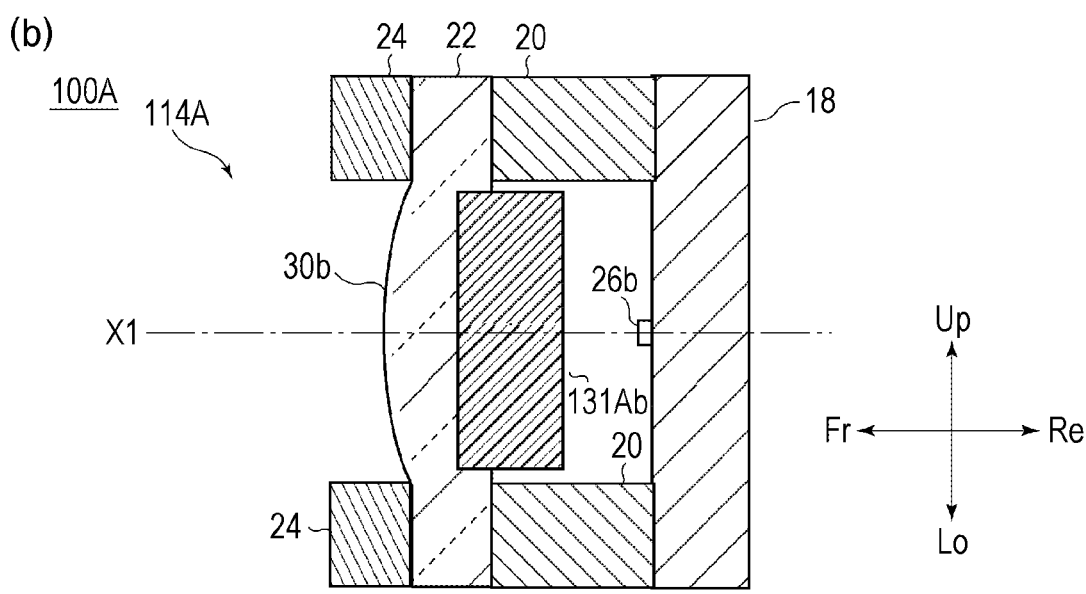

FIG. 9
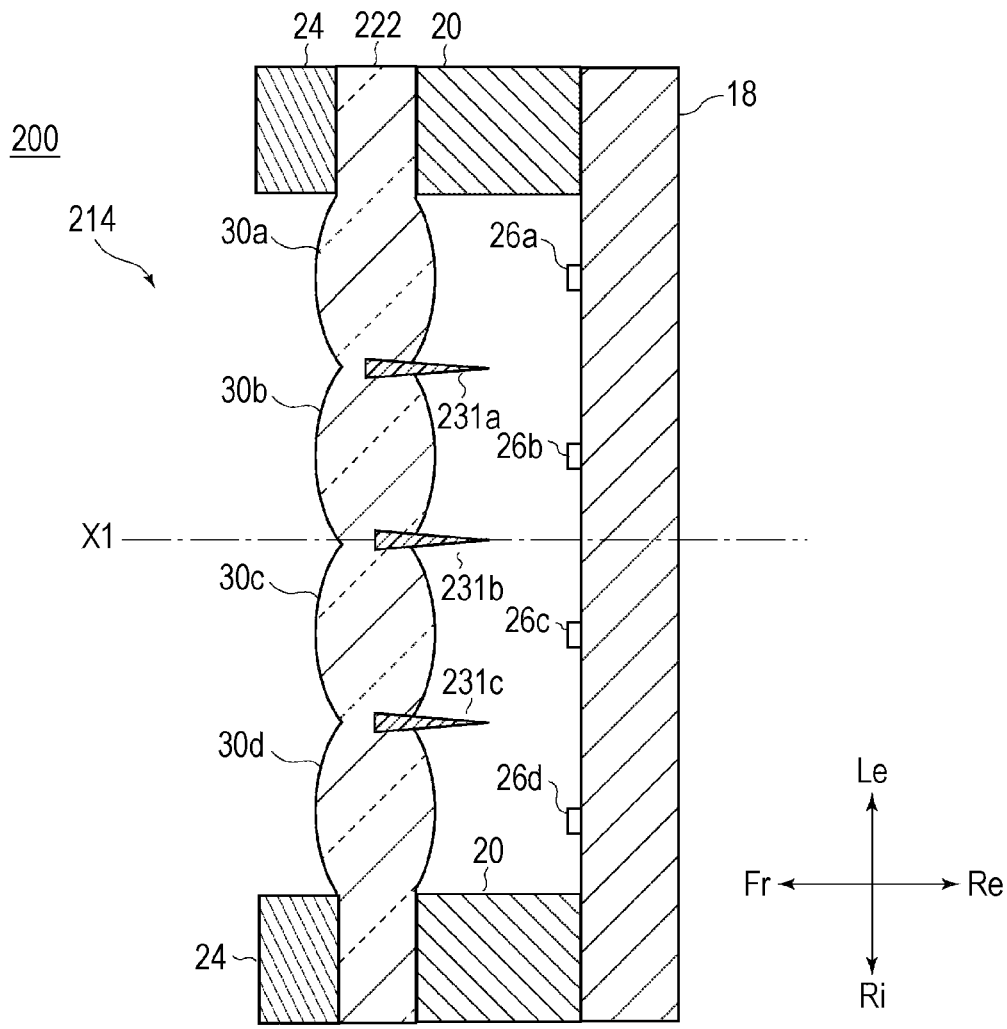
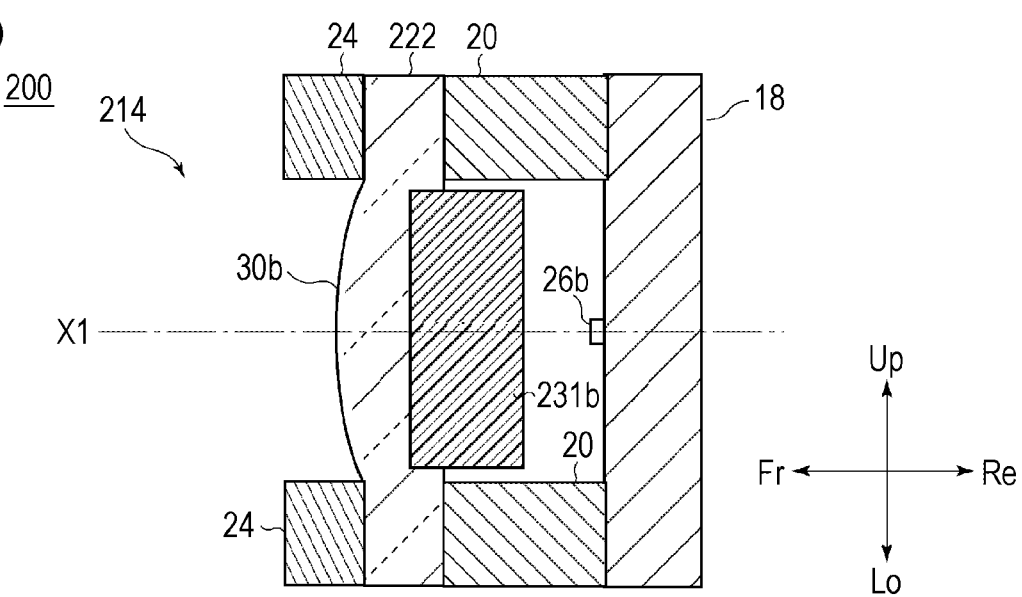

FIG. 10
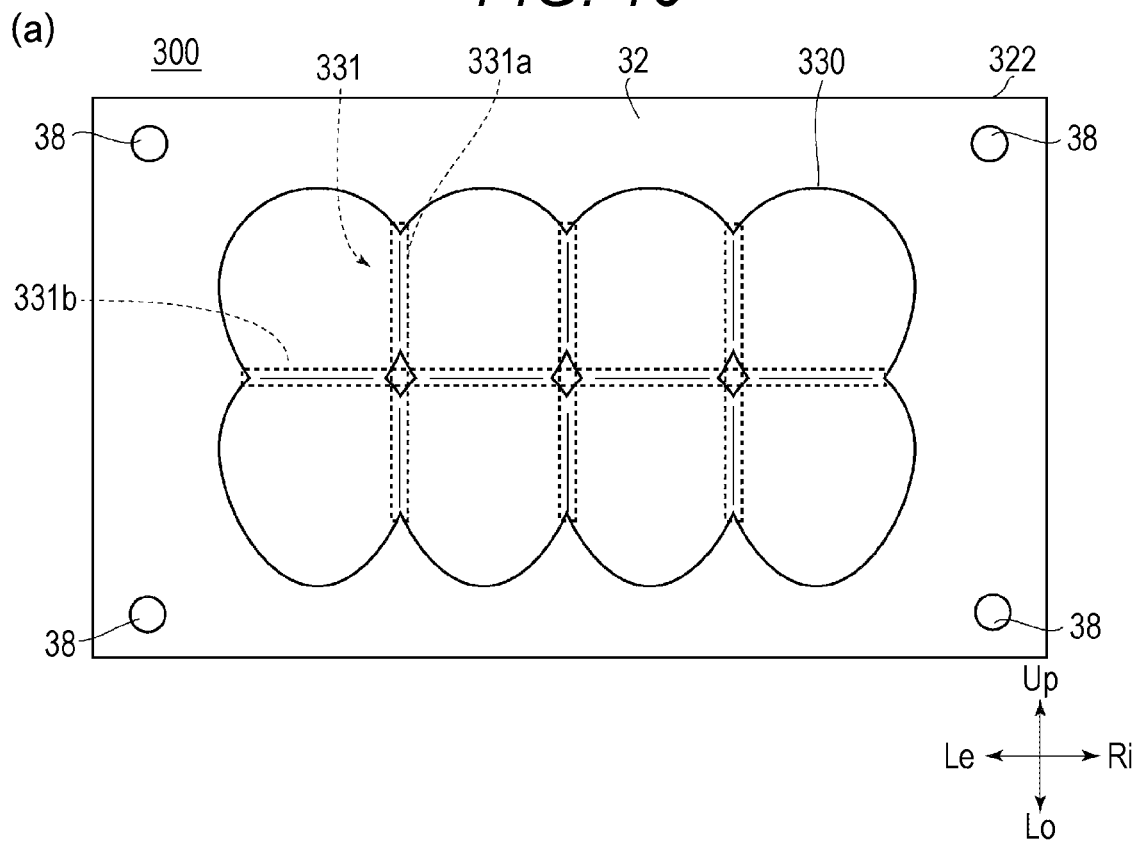
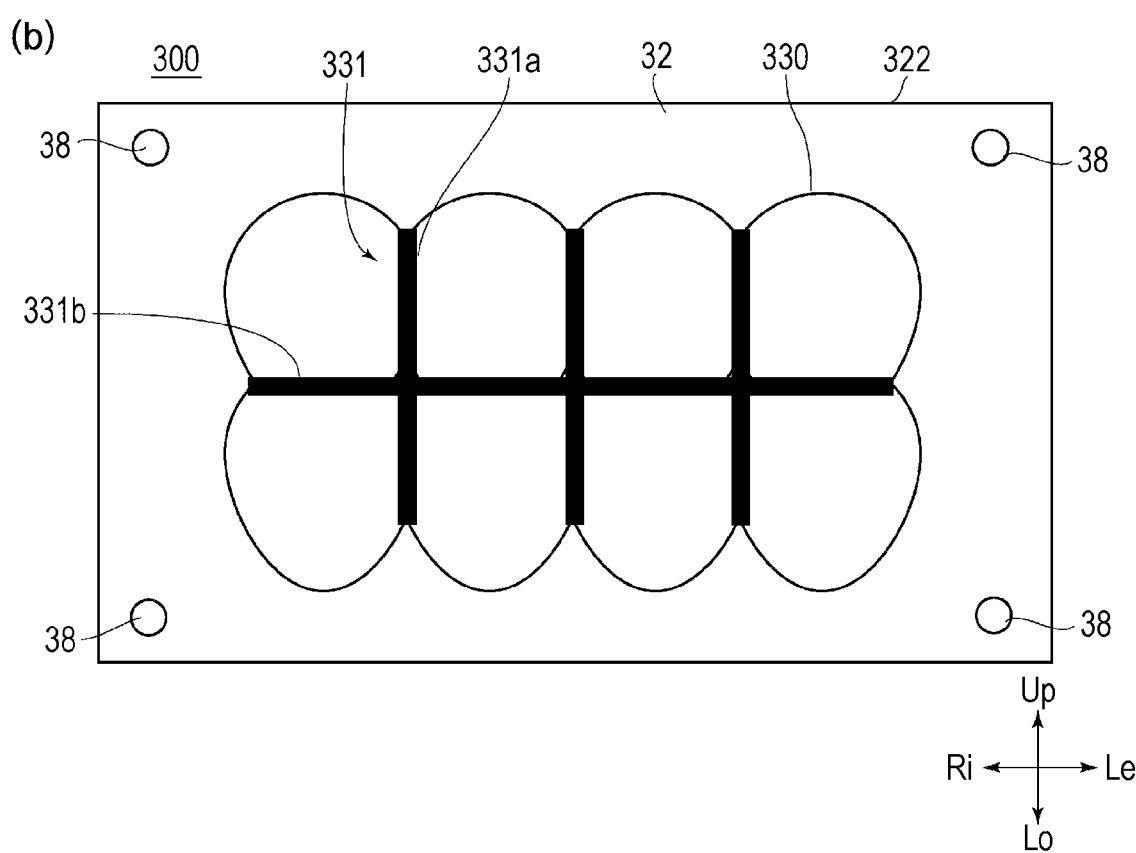

OPTICAL UNIT

TECHNICAL FIELD

The present invention relates to an optical unit, and more particularly to the optical unit including a plurality of light sources.

BACKGROUND ART

In the related art, an optical unit for a vehicle lamp is known in which a plurality of light sources and a plurality of lenses respectively provided to correspond to each of the light sources are used, to form a plurality of light source images on a rear focal plane of a projection lens, and projected images of the light source images are projected forward by the projection lens, so that an integrated light distribution pattern is formed (see, for example, PATENT LITERATURE 1).

In the optical unit using the light sources and the lenses, a light ray emitted from one light source is incident on lenses other than the corresponding lens, to form an unintended light distribution, which may give glare to a vehicle in front.

Therefore, in PATENT LITERATURE 1, it is proposed to provide partition members extending to partition two adjacent lenses among the lenses.

CITATION LIST

Patent Literature

PATENT LITERATURE 1: JP-A-2011-171002

SUMMARY OF INVENTION

Problems to be Solved by Invention

However, the lens provided for condensing light from the light source to form the light source image on the rear focal plane of the projection lens has a small size, and there has been a problem that a configuration in which the partition members are provided between the lenses is complicated, the number of parts is large and an assembly work is difficult. Therefore, there has been a problem that an assembly error increases.

The present invention has been made in view of such circumstances, and an object of the present invention is to provide an optical unit capable of preventing unintended light distribution and having a small assembly error while using a plurality of light sources and a plurality of lenses.

Solution to Problems

In order to achieve the object described above, an optical unit according to an aspect of the present invention includes: a plurality of light sources; a plurality of first lenses integrally formed, respectively arranged to correspond to each of the light sources, condensing light from the corresponding light sources, and forming corresponding light source images on a predetermined virtual plane; a second lens projecting projected images of the light source images forward; and a light-shielding member extending between two adjacent first lenses in the first lenses, and shielding light passing through one first lens so as not to enter the other first lens, in which the light-shielding member and the first lenses are integrally formed by two-color molding.

According to the above aspect, in the optical unit including the light sources and the first lenses, since it is configured such that the light-shielding member is provided between the two adjacent first lenses, and light from an unintended light source is not emitted forward, unintended light distribution can be prevented.

Further, according to the above aspect, the first lenses are integrally formed, and the light-shielding member and the first lenses are integrally formed by two-color molding. Therefore, it is possible to assemble the lenses and to assemble the lenses and the light-shielding members at the same time, and a manufacturing time can be reduced, so that the assembly work is simple. Further, it is possible to reduce an assembly error that occurs when the first lenses and the light-shielding members are separate members.

In the above aspect, it is preferred that the light-shielding member is provided to project from an inside toward a rear surface in a thickness direction of the first lens, and the light-shielding member is formed in a wedge shape that increases in thickness toward the rear surface of the first lens.

Further, in the above aspect, it is preferred that the light-shielding member is provided to project from an inside toward a rear surface in a thickness direction of the first lens, and the light-shielding member is formed in an inverted wedge shape that decreases in thickness toward the rear surface of the first lens.

Further, in the above aspect, it is preferred that the light-shielding member is made of a material having transmittivity.

Effects of Invention

According to the above aspect, it is possible to provide an optical unit capable of preventing unintended light distribution and having a small assembly error while using a plurality of light sources and a plurality of lenses.

BRIEF DESCRIPTION OF DRAWINGS

FIG. 4(a) is a cross-sectional view of the light source unit taken along a line IVA-IVA of FIG. 3, and FIG. 4(b) is a cross-sectional view of the light source unit taken along a line IVB-IVB of FIG. 3.

FIG. 5 is a diagram schematically illustrating optical paths of light passing through first lenses according to the first embodiment.

FIG. 7(a) is a cross-sectional view of the light source unit included in a lamp unit according to a second embodiment of the present invention, which corresponds to FIG. 4(a), and FIG. 7(b) is a cross-sectional view of the light source unit, which corresponds to FIG. 4(b).

FIG. 8(a) is a cross-sectional view of the light source unit according to a modification of the second embodiment, which corresponds to FIG. 4(a), and FIG. 8(b) is a cross-sectional view corresponding to FIG. 4(b).

FIG. 9(a) is a cross-sectional view corresponding to FIG. 4(a) of the light source unit included in a lamp unit according to a third embodiment of the present invention, and FIG. 9(b) is a cross-sectional view corresponding to FIG. 4(b).

FIG. 10(a) is a front view of a lens module included in an optical unit according to a fourth embodiment of the present invention, and FIG. 10(b) is a rear view of the lens module.

DESCRIPTION OF EMBODIMENTS

Figure 1:
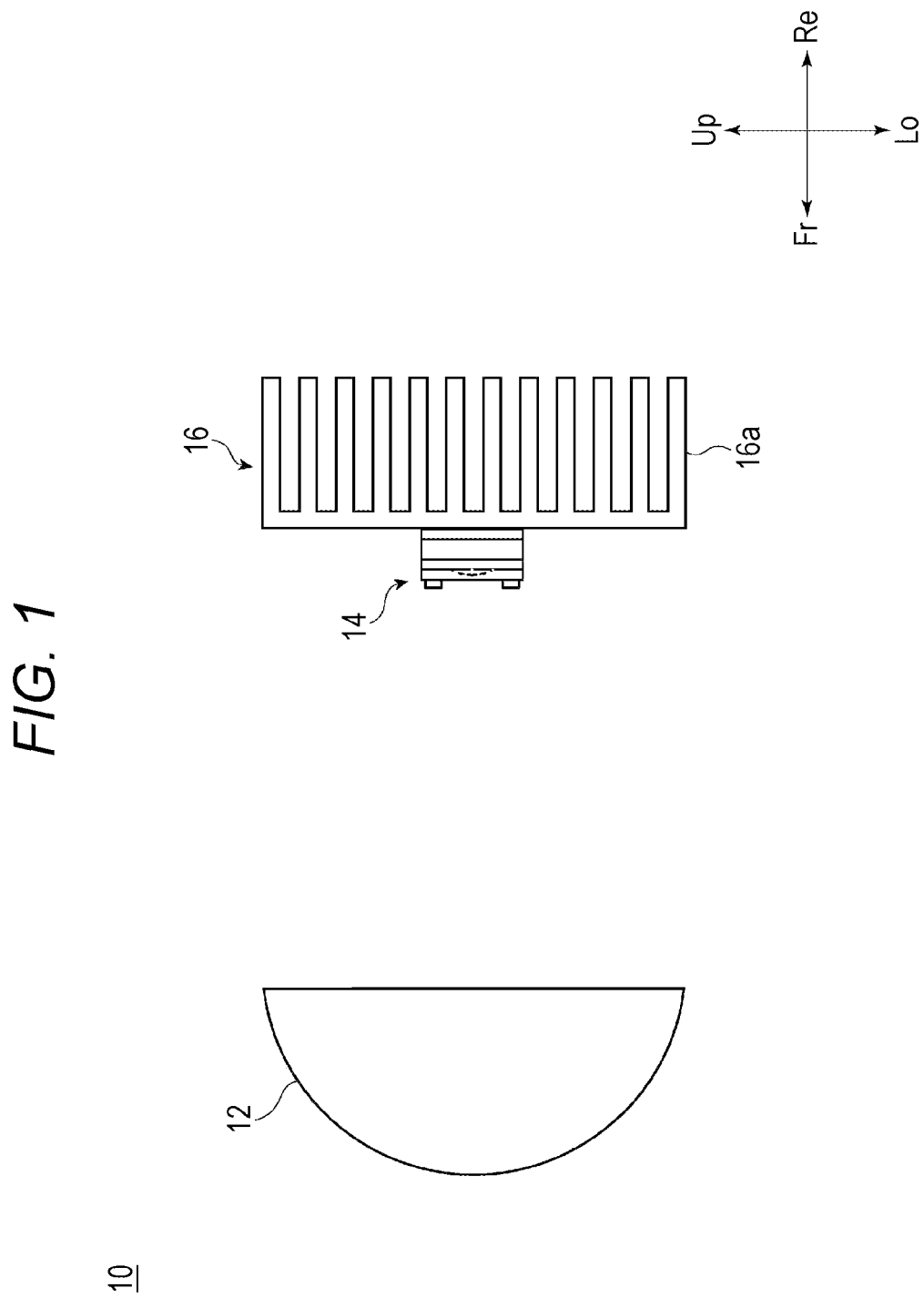
FIG. 1 is a side view of an optical unit according to a first embodiment of the present invention.

Hereinafter, preferred embodiments of the present invention will be described with reference to the drawings. The embodiments are not limited to the invention, but are exemplary, and all features and combinations thereof described in the embodiments are not necessarily essential to the invention.

In the following description of the embodiments, the same components and members are denoted by the same reference numerals, and the components and members having the same functions are denoted by the same names, and duplicate description will be omitted as appropriate. Further, unless otherwise specified, directions such as front, rear, left, and right mean directions when an optical unit, that is, a lamp including the optical unit is viewed from the front. Further, in each figure, an arrow Up-Lo indicates an upper-lower direction, an arrow Le-Ri indicates a left-right direction, and an arrow Fr-Re indicates a front-rear direction.

First Embodiment

FIG. 1 is a side view of an optical unit 10 according to a first embodiment. The optical unit 10 is an optical unit used for a vehicle lamp, and is used, for example, for vehicle headlights.

The optical unit 10 mainly includes a second lens 12, a light source unit 14 including a plurality of first lenses 30 (FIG. 2) described in detail below, and a heat sink 16.

The second lens 12 is a projection lens formed of a transparent resin, which is a plano-convex aspherical lens having a convex front surface and a flat rear surface. The second lens 12 projects a projected image of a light source image formed on a rear focal plane of the second lens 12 as an inverted image on a predetermined virtual plane in front of the lamp.

The heat sink 16 is, for example, made of a metal such as aluminum, has a rectangular plate-like front surface, and has a rear portion formed in a shape forming a cooling fin 16a. Further, screw holes (not illustrated) for attaching the light source unit 14 are provided at four positions near a center of the front surface of the heat sink 16.

Figure 2:
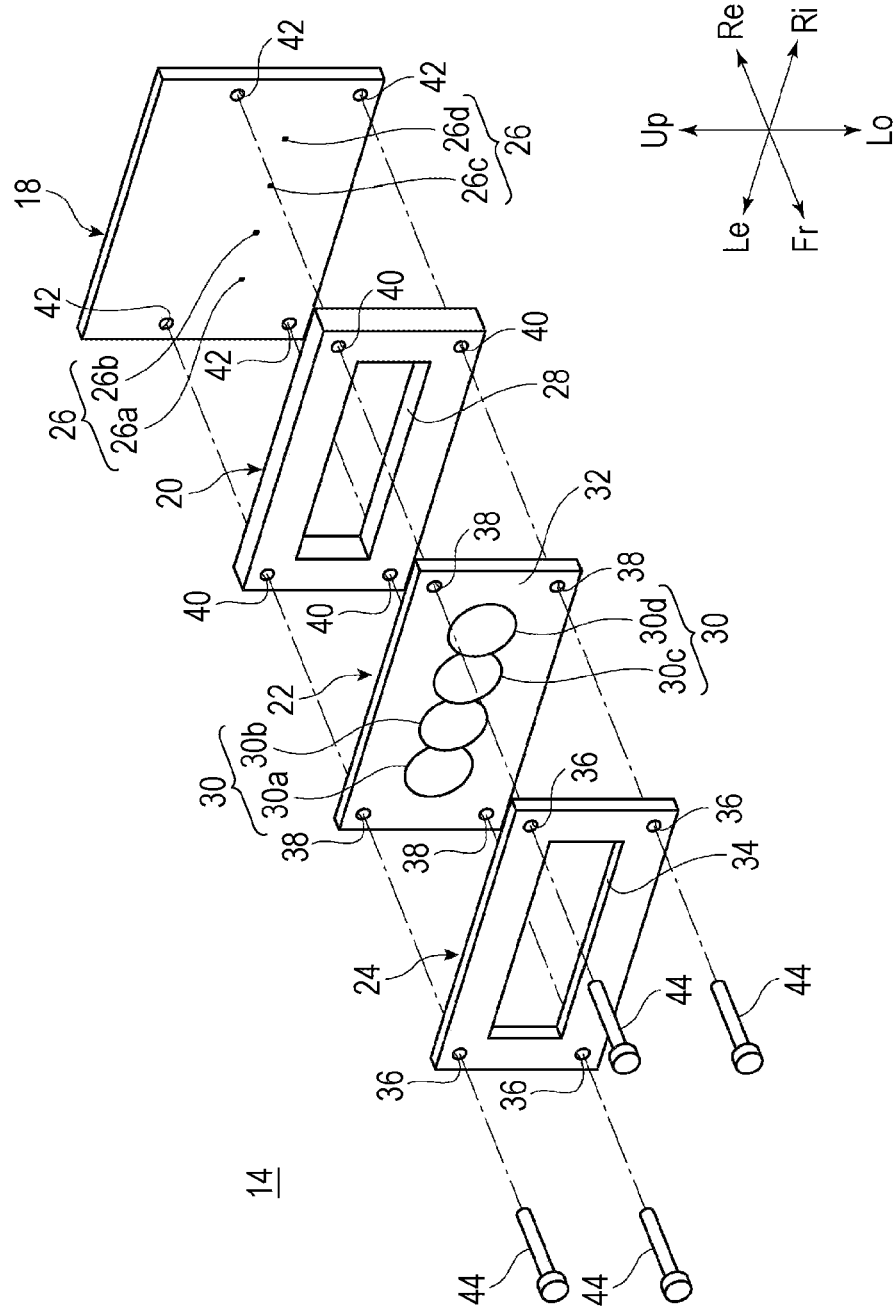
FIG. 2 is an exploded perspective view of a light source unit included in the optical unit.

As illustrated in FIG. 2, the light source unit 14 includes a rectangular substrate 18, a lens holder 20, a lens module 22, and a metal cover 24 in this order from the rear.

A plurality of light sources 26 is mounted on a front surface of the substrate 18 at a predetermined distance from each other. As the light source 26, for example, a light emitting module formed of a light emitting element such as a light emitting diode (LED) or a laser diode and emitting white light is employed. For example, specifically, the light source 26 is configured by covering a blue LED that emits blue light with a phosphor that converts the blue light into yellow light.

In an illustrated example, four light sources 26a, 26b, 26c, and 26d are used, but the number of light sources is not limited to four, and can be appropriately set according to the purpose and need of the lamp. Further, in the illustrated example, the light sources 26 are arranged at equal intervals, but the intervals of the light sources can also be appropriately set according to the purpose and need of the lamp.

Further, although not illustrated, the light sources 26 are connected to a power supply connector and a control connector by a conductive wire of a metal wire provided on the substrate 18, and constitute an excitation light source array that is supplied with power from a power source and is turned on and off under the control of a control device, to be used for variable light distribution vehicle headlights.

The lens holder 20 is a horizontally long rectangular plate-like member made of a metal such as aluminum or stainless steel, having a horizontal width equal to that of the substrate 18 and a vertical width shorter than that of the substrate 18. Further, the lens holder 20 has a horizontally long rectangular opening 28 having a size corresponding to the first lenses 30, in a center thereof. The lens module 22 is disposed at a predetermined distance from the light source 26 by the lens holder 20.

The lens module 22 is a lens complex mainly formed of a transparent or translucent resin, and includes the first lenses 30. The lens module 22 has an outer shape formed in a shape of a horizontally long rectangular plate that is congruent with the front view lens holder 20.

The first lenses 30 (30a, 30b, 30c, and 30d) are integrally formed in series in a longitudinal direction in a center of the lens module 22. The first lens 30 is a biconvex lens in which a front surface is a convex surface and a rear surface is also a convex surface, and is formed to project in the front-rear direction from a base portion 32 extending to the peripheral edge of the lens module 22. Note that the front surface and the rear surface of each of the first lenses 30a, 30b, 30c, and 30d are lenses having a free curved surface and having a substantially elliptical shape vertically long in a front view, but for convenience of drawing, they are illustrated as circular lenses in a front view in FIG. 2.

The metal cover 24 is made of a metal such as aluminum or stainless steel, and is a horizontally long rectangular plate-like member having the same size as the lens module 22. Further, in a center of the metal cover 24, a rectangular opening 34 having a size corresponding to the first lenses 30 of the lens module 22 is provided.

Screw holes 36 are respectively provided at four corners of the metal cover 24. Further, four screw holes for each of screw holes 38, 40, and 42 are respectively provided at positions of the lens module 22, the lens holder 20, and the substrate 18 corresponding to the four screw holes 36 of the metal cover.

The light source unit 14 is attached to the front surface of the heat sink 16 by stacking the substrate 18, the lens holder 20, the lens module 22, and the metal cover 24 in this order from the rear, and by screwing four mounting screws from the front respectively into four screw holes (not illustrated) provided on the front surface of the heat sink 16 (FIG. 1). The light source unit 14 is disposed so that an optical axis X1 (FIG. 4) of the second lens 12 passes through a center of the light sources 26.

Here, a detailed structure of the lens module 22 will be described with reference to FIGS. 3 and 4.

Figure 3:
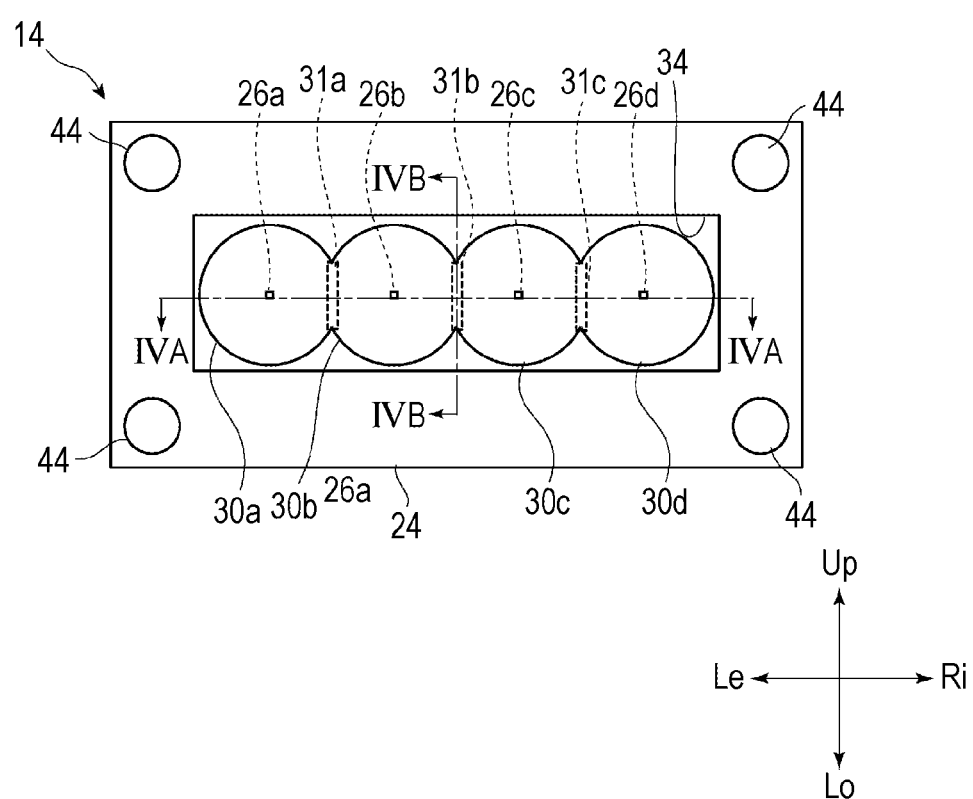
FIG. 3 is a front view of the light source unit.

FIG. 3 is a front view of the light source unit 14, FIG. 4(A) is a cross-sectional view of the light source unit 14 taken along a line IVA-IVA of FIG. 3, and FIG. 4(B) is a cross-sectional view of the light source unit 14 taken along a line IVB-IVB of FIG. 3.

As described above, the lens module 22 is the lens complex formed of a transparent or translucent resin. As the resin of a material, for example, a transparent or translucent silicone resin is used. Alternatively, a transparent or translucent melamine resin, phenol resin, or epoxy resin may be used. Further, the resin of the material preferably has high heat resistance.

As illustrated in FIG. 4(a), the first lenses 30a, 30b, 30c, and 30d are respectively arranged to correspond to each of the light sources 26a, 26b, 26c, and 26d. Specifically, optical axes X2a, X2b, X2c, and X2d of the first lenses 30a, 30b, 30c, and 30d are respectively arranged to pass through centers of the light sources 26a, 26b, 26c, and 26d.

Light-shielding members 31 (31a, 31b, and 31c) are provided between two adjacent lenses among the first lenses 30.

The light-shielding member 31 has an elliptical shape with a flat horizontal cross-section, is a flat elliptical cylinder extending in the upper-lower direction substantially the same as a length in the upper-lower direction of the first lens 30, and is made of a light-shielding resin such as a colored silicon resin. The light-shielding member 31 is provided to project from an inside toward a rear surface in a thickness direction of the first lenses 30.

Note that in this specification, the term "light-shielding property" does not only mean completely shielding a light ray, but also shielding light to an extent that glare is not generated even when the light incident on the light-shielding member is incident on an unintended lens.

Therefore, as the light-shielding resin, one that does not completely shield the light but has transmittivity may be used. As described above, when the light-shielding member 31 has transmittivity, light energy is hard to be absorbed and heat generation of the light-shielding member 31 is suppressed, so that it is advantageous because deformation or the like of the lens module can be prevented.

The lens module 22 and the light-shielding member 31 are integrally formed by two-color molding. First, the first lens 30 and the base portion 32 are integrally formed by a primary mold. Subsequently, the light-shielding resin is injected into a secondary mold.

FIG. 5 is a diagram schematically illustrating optical paths of light passing through the first lenses 30a, 30b, 30c, and 30d with arrows. Solid arrows indicate light emitted from upper ends of the light sources 26a, 266, 26c, and 26d, and broken arrows indicate light emitted from lower ends of the light sources 26 (26a, 26b, 26c, and 26d).

Further, FIG. 5 illustrates the same cross-sectional view as that of FIG. 4(a), but hatching indicating a cross-section is omitted as appropriate. Further, although a rear focal plane Y of the second lens 12 is actually formed in a curved surface shape, the rear focal plane Y is illustrated here as a flat surface for convenience. Furthermore, for convenience of explanation, the light sources 26a, 26b, 26c, and 26d are illustrated in an enlarged manner.

As illustrated in FIG. 5, the first lenses 30a, 30b, 30c, and 30d respectively condense emitted light of the corresponding light sources 26a, 26b, 26c, and 26d, and form individual light source images 48a, 48b, 48c, and 48d having edges in contact with each other and lined up in a row, on the rear focal plane Y. The second lens 12 projects projected images of the individual light source images to the front of the lamp, to form an integrated light distribution pattern.

Figure 6:
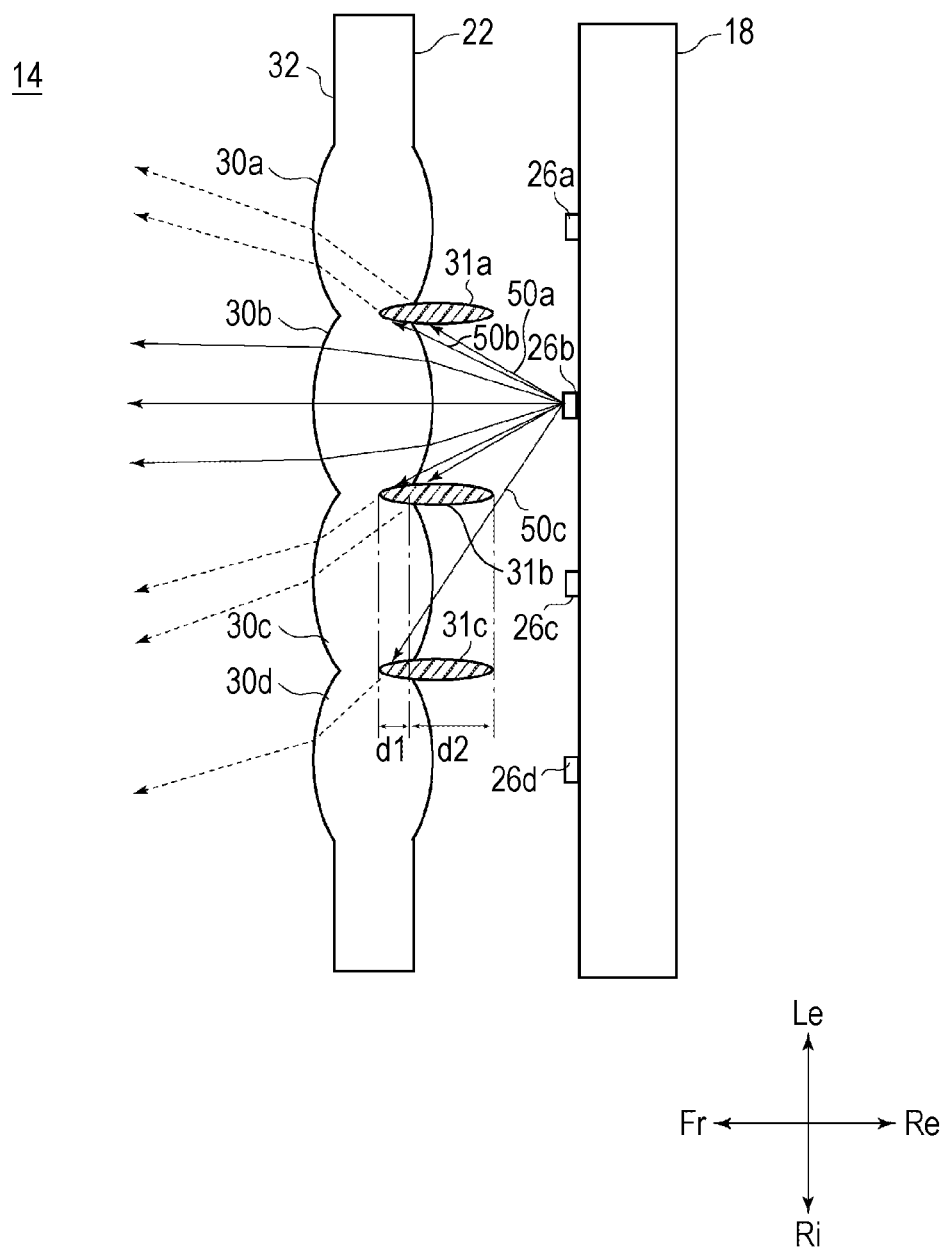
FIG. 6 is a diagram schematically illustrating the optical path of the light passing through the first lenses according to the first embodiment.

FIG. 6 is a diagram schematically illustrating the optical path of the light emitted from the light source 26b as a representative in order to explain a function of the light-shielding members 31 (31a, 31b, and 31c) according to the present embodiment. The light emitted from the center of the light source 26b is indicated by arrows as a representative, solid arrows indicate the optical path of actual light, and broken arrows indicate the optical path of light assuming that the light-shielding members 31 are not present.

Specifically, the light emitted from the light source 26b exhibits Lambertian characteristics and is incident on the first lens 30b. Therefore, light 50a and 50b incident on the lens module 22 is present outside a range of a capture angle of the corresponding first lens 30b, but the light-shielding members 31a and 31b shield such light, to prevent the light emitted from the specific light source 26b from entering the unintended first lenses 30a and 30c.

Therefore, a length d1 of a portion of the light-shielding member 31 extending in the first lens 30b is designed so that the light traveling in the first lens 30b does not enter the adjacent first lenses 30a and 30c. Further, the length d1 is also preferably designed to be long enough to prevent the light 50c from entering the further adjacent first lens 30d when the light 50c from the light source 26b is not incident on the light-shielding member 31b Further, a length d2 of the light-shielding member 31 projecting rearward of the first lens is designed to be long enough to prevent the light of the light source 26b from entering the adjacent first lenses 30a and 30c.

Note that when the light-shielding members 31 are not present, the light incident on the first lens 30b travels through the adjacent first lenses 30a and 30c, to be emitted forward of the lamp as indicated by the broken line. This causes a light distribution pattern as if the light sources 26a and 26c are unintentionally turned on when the light source 26b is turned on and the light sources 26a and 26c are turned off, which causes glare on an oncoming vehicle. In the present embodiment, by providing the light-shielding members 31, such unintended light distribution is prevented, and glare is prevented from being given to the oncoming vehicle.

Further, in the present embodiment, the first lenses are integrally formed as the lens module 22, and the light-shielding members 31 and the first lenses 30 are integrally formed by two-color molding. Therefore, it is possible to assemble the lenses and to assemble the lenses and the light-shielding members 31 at the same time, the manufacturing time can be reduced, so that the assembly work is simple. Further, it is possible to reduce the assembly error that occurs when the first lenses 30 and the light-shielding members 31 are separate members.

Second Embodiment

An optical unit 100 according to a second embodiment of the present invention has substantially the same configuration as the optical unit 10 according to the first embodiment except for light-shielding members 131 in a lens module 122. FIGS. 7(a) and 7(b) are cross-sectional views of a light source unit 114 of the optical unit 100, which correspond to FIGS. 4(a) and 4(a) of the light source unit 14. The light-shielding members 131 (131a, 131b, and 131c) are provided to project from the inside toward the rear surface in the thickness direction of the first lenses 30, and are formed in a shape of a wedge that increases in thickness toward the rear surface of the first lenses 30. That is, the light-shielding member 131 is a flat triangular prism body having a horizontal cross-section of an isosceles triangle with an acute-angled apex on the front side, and extending in the upper-lower direction at least as long as the length in the upper-lower direction of the first lens.

With such a shape, a portion occupied by the light-shielding member in the lens is small, and the light passing through the inside of the lens can be effectively used.

Modification 1

As a modification of the present embodiment, as illustrated in FIG. 8, the shape of the light-shielding members 131A (131Aa, 131Ab, and 131Ac) may has a horizontal cross-section in which a portion extending in the lens is an isosceles triangle with an acute-angled apex on the front side, and a portion projecting rearward of the lens has a semi-elliptical shape elongated in the front-rear direction. When the light-shielding members 131a, 131b, and 131c according to the second embodiment are to be integrally formed with the first lenses by two-color molding, since a width of a rear end portion of the light-shielding members 131a, 131b, and 131c is larger than that of a joint portion with the first lens 30, it is necessary to forcibly pull out the light-shielding member in mold opening of the secondary mold. If it is configured like the light-shielding members 131A (131Aa, 131Ab, and 131Ac), it is not necessary to forcibly pull out the light-shielding members 131A, and yield of the product is not reduced.

Third Embodiment

An optical unit 200 according to a third embodiment of the present invention has substantially the same configuration as the optical unit 10 according to the first embodiment except for the light-shielding members 231 (231a, 231b, and 231c) in a lens module 222. FIGS. 9(a) and 9(b) are cross-sectional views of the light source unit 214 of the optical unit 200, which correspond to FIGS. 4(a) and 4(b) of the light source unit 14. The light-shielding member 231 is provided to project from the inside toward the rear side in the thickness direction of the first lens 30, and is formed in an inverted wedge shape that decreases in thickness toward the rear surface of the first lens 30. That is, the light-shielding member 231 (231a, 231b, and 231c) is a flat triangular prism body having a horizontal cross-section of an isosceles triangle with an acute-angled apex on the rear side, and extending in the upper-lower direction at least as long as the length in the upper-lower direction of the first lens.

When the lens module 222 and the light-shielding members 231a, 231b, and 231c are formed by two-color molding, since the materials thereof are different, boundary surfaces between a smaller member (here, the light-shielding member 231) and a larger member (here, the lens module 22) may be separated from each other, and the smaller member may fall off. However, if it is configured like the light-shielding member 231, a lens inner side of the light-shielding member 231 is wider than a lens surface side thereof, so that the light-shielding member 231 can be prevented from falling off.

Fourth Embodiment

An optical unit 300 according to a fourth embodiment of the present invention has substantially the same configuration as the optical unit 10 according to the first embodiment except for dimensions of a lens module 322, a light-shielding member 331, and the light source unit. As illustrated in FIGS. 10(a) and 10(b), the lens module 322 includes a plurality of first lenses 330. The first lenses 330 are integrally formed in a matrix shape that is not only juxtaposed in a horizontal direction but also juxtaposed in a vertical direction.

Between two adjacent first lenses 330 on the rear surface of the lens module 322, the light-shielding member 331 made of the same material as the light-shielding member 31 is integrally formed with the lens module 322 (first lenses 330) by two-color molding.

The light-shielding member 331 has a vertical portion 331a extending in the upper-lower direction and a horizontal portion 331b extending in the left-right direction. Like the light-shielding member 31, the vertical portion 331a and the horizontal portion 331b are elliptical columnar bodies having a cross-section of a flat elliptical shape, and by forming the vertical portion 331a and the horizontal portion 331b combined in a grid pattern, the light emitted from a specific light source is prevented from entering an unintended first lens that is adjacent to the corresponding first lens in the left-right and upper-lower directions and causing an unintended light distribution.

Needless to say, arrangement and the number of the first lenses 330 can be set as needed. As described above, according to the present embodiment, since various lens arrangements can be supported, a degree of freedom in design is increased.

When the first lenses 330 and the light-shielding member 331 are separate bodies, if the number of the first lenses 330 increases, the number of parts increases and an assembling work is complicated. In addition, the assembly error is large. In the present embodiment, since the first lens 330 and the light-shielding member 331 are integrally formed, the light source unit can be assembled by simply screwing the lens module 322 together with the substrate, the lens holder, and the metal cover to the front surface of the heat sink as in the first embodiment, which simplifies the assembly work and reduces the assembly error.

Other Modifications

Further, in each of the above embodiments, the same lenses are used as the first lenses, but shapes and sizes of the lenses can be appropriately designed.

Although the preferred embodiments of the present invention have been described above, the present invention is not limited to the embodiments, and various modifications and changes based on the present disclosure are included in the scope of the present invention.

This international application claims priority based on Japanese Patent Application No. 2019-041268 filed on Mar. 7, 2019, and the entire contents of Japanese Patent Application No. 2019-041268, which is the Japanese patent application, is incorporated by reference in this international application.

The above description of a specific embodiment of the present invention is presented for purposes of illustration. They are not intended to be exhaustive or to limit the present invention to the embodiments described above as they are. It is self-evident to those skilled in the art that numerous modifications and changes can be made in the light of the above description.

LIST OF REFERENCE SIGNS 10, 100, 200, 200A, 300: Optical unit, 12: Second lens, 26 (26a, 26b, 26c, 26d): Light source, 30 (30a, 30b, 30c, 30d), 300: First lens, 31 (31a, 31b, 31c), 131 (131a, 131b, 131c), 131A (131Aa, 131Ab, 131Ac), 231 (231a, 231b, 231c), 331: Light-shielding member.

The invention claimed is:

1. An optical unit comprising:
a plurality of light sources;
a plurality of first lenses integrally formed, respectively arranged to correspond to each of the light sources, condensing light from the corresponding light sources, and forming corresponding light source images on a predetermined virtual plane;
a second lens projecting projected images of the light source images forward; and
a light-shielding member comprising an extending portion extending between two adjacent first lenses in the plurality of first lenses, an end of the extending portion being within the first lenses so that the light-shielding member shielding light passing through one of the first lenses so as not to enter the other one of the first lenses,
wherein the light-shielding member comprises a projecting portion projecting outside from a rear surface of the first lenses facing the light sources in a thickness direction of the first lenses,
and
the light-shielding member that comprises the extending portion and the projecting portion is formed in a wedge shape that increases in thickness toward the rear surface of the first lenses.

2. The optical unit according to claim 1, wherein the light-shielding member is made of a material having transmittivity.

3. The optical unit according to claim 1, wherein the light-shielding member and the first lenses are integrally formed.

4. The optical unit according to claim 1, wherein a depth of the extending portion within the first lenses in the thickness direction of the first lenses is set so that a light traveling from one of the plurality of light sources toward one of the plurality of first lenses that is most proximity to the one of the light sources does not enter another one of the plurality of first lenses next to the one of the plurality of the first lenses.

5. The optical unit according to claim 1, wherein a length of the projecting portion in the thickness direction of the first lenses is set so that a light traveling from one of the plurality of light sources toward one of the plurality of first lenses that is most proximity to the one of the light sources does not enter another one of the plurality of first lenses next to the one of the plurality of the first lenses.

6. The optical unit according to claim 1, wherein the light-shielding member has a vertical cross-section extending in an upper-lower direction at least as long as a length in the upper-lower direction of the first lens.

7. The optical unit according to claim 1, wherein a height of a vertical cross-section of the light-shielding member when viewed in a direction perpendicular to the thickness direction of the first lenses and perpendicular to a horizontal cross-section of the first lenses is the same as a length of the first lenses when viewed in a thickness direction of the first lenses and perpendicular to the horizontal cross-section of the first lenses.

8. An optical unit comprising:
a plurality of light sources;
a plurality of first lenses integrally formed, respectively arranged to correspond to each of the light sources, condensing light from the corresponding light sources, and forming corresponding light source images on a predetermined virtual plane;
a second lens projecting projected images of the light source images forward; and
a light-shielding member comprising an extending portion extending between two adjacent first lenses in the plurality of first lenses, an end of the extending portion being within the first lenses so that the light-shielding member shielding light passing through one of the first lenses so as not to enter the other one of the first lenses,
wherein the light-shielding member comprises a projecting portion projecting outside from a rear surface of the first lenses facing the light sources in a thickness direction of the first lenses, and
the light-shielding member that comprises the extending portion and the projecting portion is formed in an inverted wedge shape that decreases in thickness toward the rear surface of the first lenses.

9. The optical unit according to claim 8, wherein the light-shielding member is made of a material having transmittivity.

10. The optical unit according to claim 8, wherein the light-shielding member and the first lenses are integrally formed.

11. The optical unit according to claim 8, wherein a depth of the extending portion within the first lenses in the thickness direction of the first lenses is set so that a light traveling from one of the plurality of light sources toward one of the plurality of first lenses that is most proximity to the one of the light sources does not enter another one of the plurality of first lenses next to the one of the plurality of the first lenses.

12. The optical unit according to claim 8, wherein a length of the projecting portion in the thickness direction of the first lenses is set so that a light traveling from one of the plurality of light sources toward one of the plurality of first lenses that is most proximity to the one of the light sources does not enter another one of the plurality of first lenses next to the one of the plurality of the first lenses.

13. The optical unit according to claim 8, wherein the light-shielding member has a vertical cross-section extending in an upper-lower direction at least as long as a length in the upper-lower direction of the first lens.

14. The optical unit according to claim 8, wherein a height of a vertical cross-section of the light-shielding member when viewed in a direction perpendicular to the thickness direction of the first lenses and perpendicular to a horizontal cross-section of the first lenses is the same as a length of the first lenses when viewed in a thickness direction of the first lenses and perpendicular to the horizontal cross-section of the first lenses.

* * * * *